United States Patent
Lai

(10) Patent No.: US 6,683,425 B1
(45) Date of Patent: Jan. 27, 2004

(54) NULL-FIELD MAGNETRON APPARATUS WITH ESSENTIALLY FLAT TARGET

(75) Inventor: Kwok F. Lai, Palo Alto, CA (US)

(73) Assignee: Novellus Systems, Inc., San Jose, CA (US)

(*) Notice: Subject to any disclaimer, the term of this patent is extended or adjusted under 35 U.S.C. 154(b) by 54 days.

(21) Appl. No.: 10/068,772

(22) Filed: Feb. 5, 2002

(51) Int. Cl.[7] .................... H01J 23/00; C23C 14/00
(52) U.S. Cl. .................... 315/500; 204/298.12
(58) Field of Search .................... 315/500, 501; 204/298.01, 298.04, 298.12, 298.13, 298.21, 298.27, 298.16, 298.17, 298.18, 298.19, 298.22

(56) References Cited

U.S. PATENT DOCUMENTS

| | | | |
|---|---|---|---|
| 4,622,121 A | 11/1986 | Wegmann et al. | |
| 4,865,712 A | 9/1989 | Mintz | |
| 5,171,415 A | 12/1992 | Miller et al. | |
| 5,188,717 A | 2/1993 | Broadbent et al. | |
| 5,252,194 A | 10/1993 | Demaray et al. | |
| 5,439,574 A * | 8/1995 | Kobayashi et al. | 204/192.12 |
| 5,482,611 A | 1/1996 | Helmer et al. | |
| 5,593,551 A | 1/1997 | Lai | |
| 6,096,180 A * | 8/2000 | Sichmann | 204/298.18 |
| 6,179,973 B1 * | 1/2001 | Lai et al. | 204/192.12 |
| 6,361,667 B1 * | 3/2002 | Kobayashi et al. | 204/298.11 |
| 6,391,163 B1 * | 5/2002 | Pavate et al. | 204/192.15 |
| 6,444,105 B1 * | 9/2002 | Lai et al. | 204/298.21 |
| 6,471,830 B1 * | 10/2002 | Moslehi et al. | 204/192.12 |
| 6,497,796 B1 * | 12/2002 | Ashtiani et al. | 204/192.12 |

* cited by examiner

*Primary Examiner*—Don Wong
*Assistant Examiner*—Minh D A
(74) *Attorney, Agent, or Firm*—Okamoto & Benedicto LLP

(57) ABSTRACT

In one embodiment, a magnetron apparatus includes an essentially flat target having a low height-to-width ratio. The essentially flat target may be planar, dish-shaped, or stepped-shape, for example. A main magnet is located behind the flat target to provide main magnetic fields. Magnets located near the target and underneath a substrate may be configured to maintain a high density plasma and to control the flow of plasma onto the substrate.

20 Claims, 12 Drawing Sheets

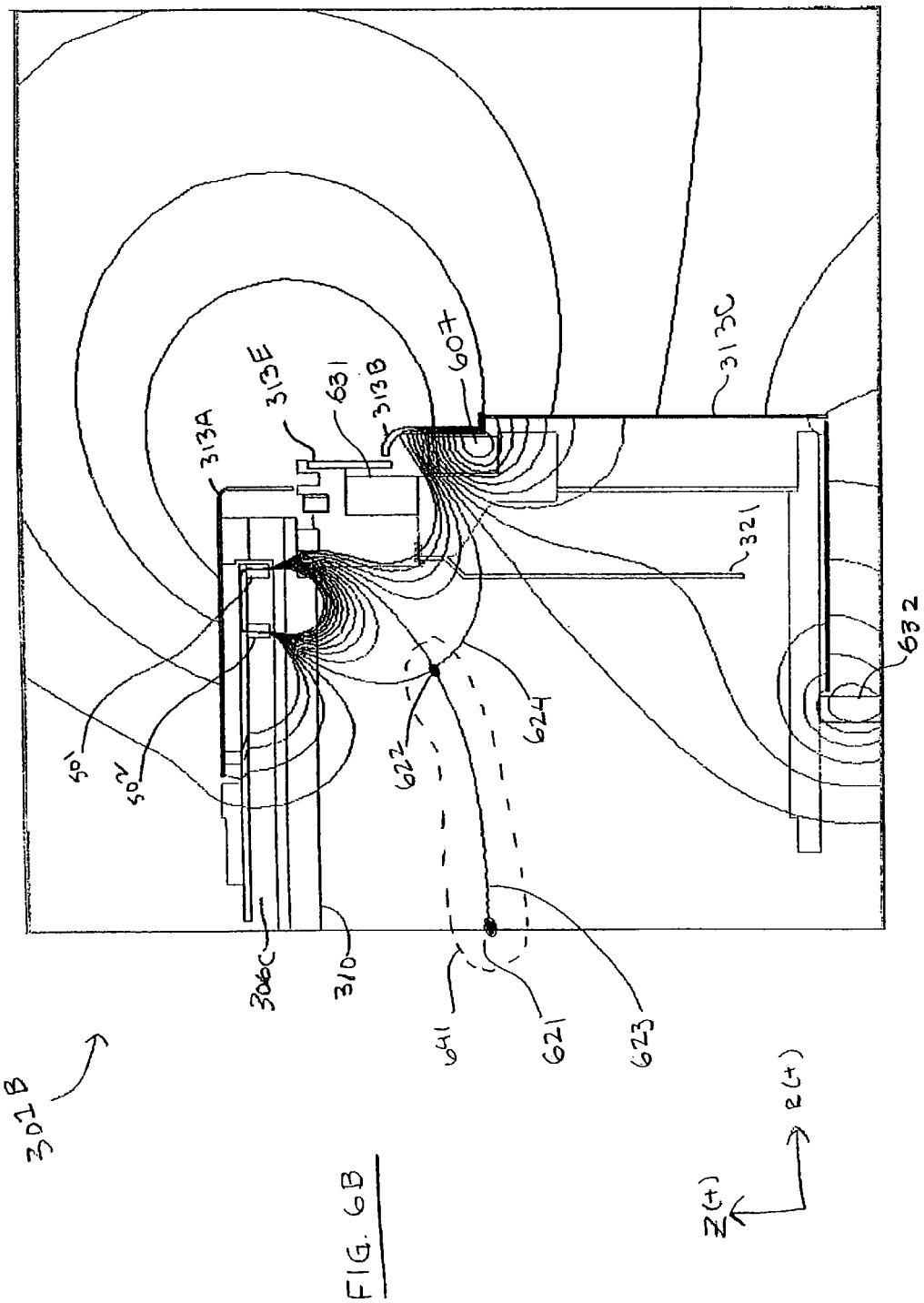

NULL-FIELD MAGNETRON APPARATUS WITH ESSENTIALLY FLAT TARGET

BACKGROUND OF THE INVENTION

1. Field of the Invention

This invention relates generally to device fabrication, and more particularly to apparatus and methods for magnetron sputtering.

2. Description of the Background Art

In a physical vapor deposition ("PVD") process, atoms sputtered from a target are deposited onto a substrate. The target, which could be made of aluminum or copper, for example, is located a distance away from the substrate. A plasma of a gas suitable for sputtering, such as argon, is maintained between the target and the substrate. Ions of the sputtering gas are accelerated onto the target. When accelerated ions hit the target, atoms are sputtered from the target and onto the substrate. The use of magnetic fields to enhance a PVD process is also known as magnetron sputtering.

In any PVD process, it is desirable to achieve good deposition uniformity both at feature level and across the substrate. It is also important to have high deposition rates in order to maximize the number of substrates that can be processed within a certain period of time. Ideally, a magnetron apparatus capable of providing good deposition uniformity at high deposition rates should also have a relatively low cost of ownership.

SUMMARY

The present invention relates to a novel magnetron apparatus. In one embodiment, a magnetron apparatus includes an essentially flat target having a low height-to-width ratio. The essentially flat target may be planar, dish-shaped, or stepped-shape, for example. A main magnet is located behind the flat target to provide main magnetic fields. Magnets located near the target and underneath a substrate may be configured to maintain a high density plasma and to control the flow of plasma onto the substrate.

These and other features and advantages of the present invention will be readily apparent to persons of ordinary skill in the art upon reading the entirety of this disclosure, which includes the accompanying drawings and claims.

DESCRIPTION OF THE DRAWINGS

FIG. 6B shows a magneto-static simulation plot of the magnetron module of FIG. 6A.

The use of the same reference label in different drawings indicates the same or like components.

DETAILED DESCRIPTION

In the present disclosure, numerous specific details are provided, such as examples of modules, components, and methods to provide a thorough understanding of embodiments of the invention. Persons of ordinary skill in the art will recognize, however, that the invention can be practiced without one or more of the specific details. In other instances, well-known details are not described to avoid obscuring aspects of the invention.

U.S. Pat. No. 5,482,611 to Helmer et al. ("the '611 patent"), incorporated herein by reference in its entirety, discloses a hollow cathode magnetron ("HCM") source. The '611 patent teaches that by providing a magnetic field having a magnetic null region at the opening of the hollow cathode, ions and electrons can be trapped and retained inside the hollow cathode except for those which have entered into the upper edge of the null region with sufficient axial velocity and very little radial velocity. Ions and electrons that have primarily axial velocity are able to leave the hollow cathode along the axis at the upper edge of the null region. Most other plasma particles, however, are reflected back and confined in the hollow cathode thereby increasing the plasma density. In essence, the shape of the magnetic field providing the magnetic null functions like a mirror which reflects most of the electrons back into the hollow cathode in order to sustain a high density plasma. To maintain charge balance, positive ions are confined in the cathode along with the electrons by ambipolar diffusion. An HCM source which provides a null-field region, such as the one described in the '611 patent, for example, is also referred to as a null-field magnetron source.

Figure 1:
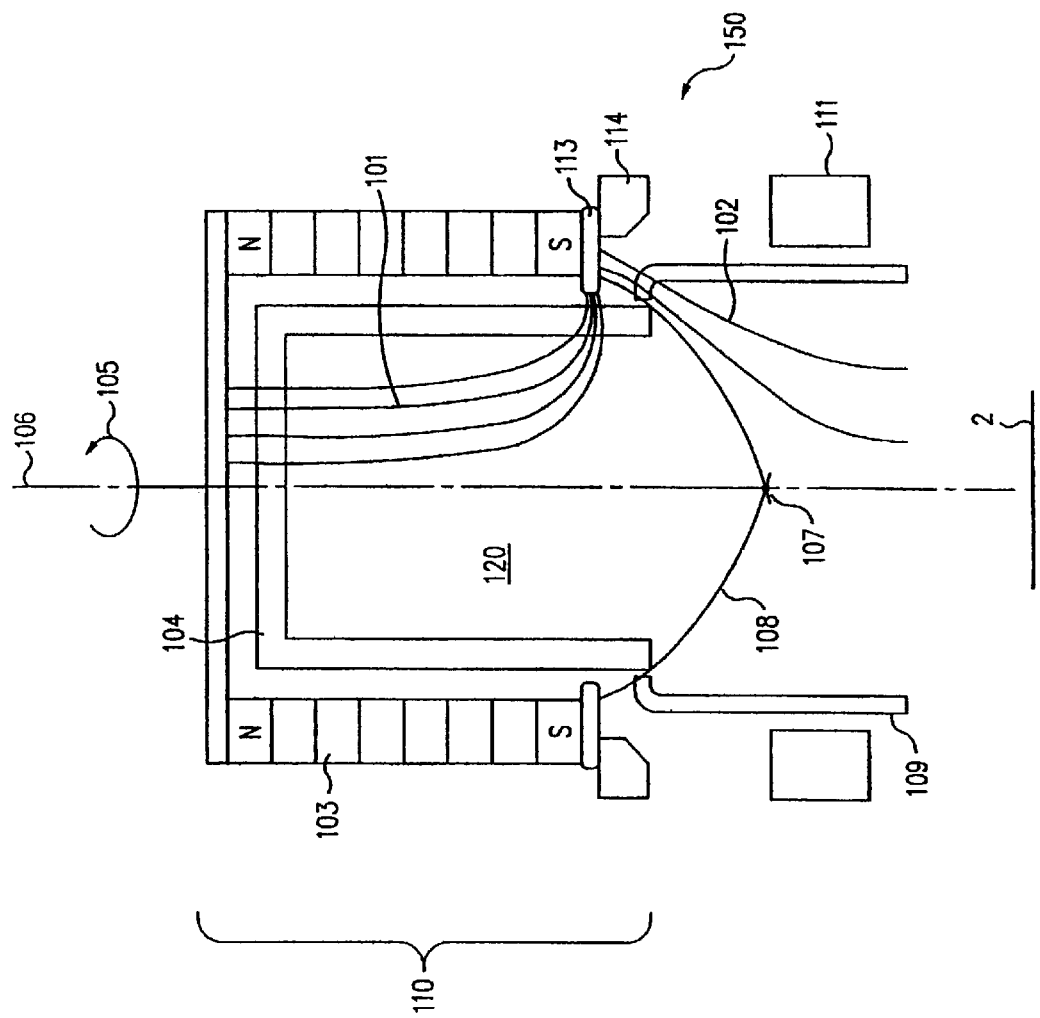
FIG. 1 shows a schematic diagram of a hollow cathode magnetron source disclosed in U.S. Pat. No. 6,179,973.

U.S. Pat. No. 6,179,973 to Lai et al. ("the '973 patent"), incorporated herein by reference in its entirety, discloses a technique for adjusting the shape of a separatrix of an HCM source to control the flow of sputtered material onto the substrate. FIG. 1 shows an HCM source 150 disclosed in the '973 patent. As indicated by arrow 105, HCM source 150 is symmetrical about axis 106. HCM source 150 has a cathode 110 and an electrically floating anode 109. Cathode 110 also includes a non-planar target 104 which provides the material to be deposited onto a substrate 2. By way of example, target 104 can be made of aluminum, tantalum, titanium, or copper. Cathode 110 and target 104 can be of any hollow non-planar shape. Also, in a typical application, target 104 has an aspect ratio tall enough to accommodate magnetic stack 103.

Plasma is generated in HCM source 150 by introducing a sputtering gas, such as argon, through an inlet (not shown) and into a container portion 120 of cathode 110. By applying a negative bias in the order of −200 VDC to −600 VDC on cathode 110 while holding the chamber at ground potential (not shown), an electric field is generated across the sputtering gas. The negative bias on cathode 110 accelerates positive ions towards target 104 to sputter atoms from target 104 and onto substrate 2.

Main magnetic stack 103 generates the main magnetic fields of HCM source 150. Magnetic stack 103 comprises a plurality of magnets which are stacked one on top of another. Magnetic stack 103 surrounds HCM source 150 about symmetry axis 106. Some field lines of magnetic stack 103, shown as field lines 101, will loop onto target 104. Other magnetic field lines will be directed away from target 104 as shown by field lines 102. As taught in the '611 patent, field lines 101 confine the majority of ions and electrons within container 120 to maintain a high density plasma. Magnetic field line 108 is the boundary between field lines 101 and field lines 102. A separatrix is a magnetic field line that intersects a magnetic null. Field line 108 is a separatrix because it intersects a magnetic null 107. The separatrix serves as the boundary between plasma confined within container 120 and plasma that has escaped.

Figure 2:
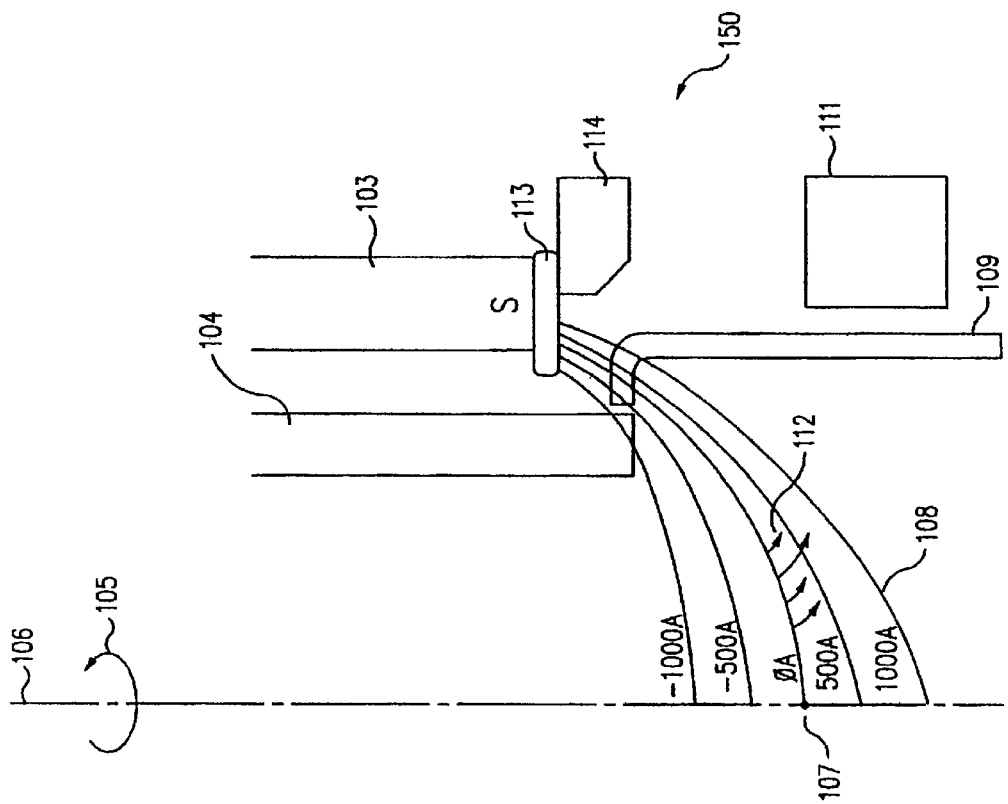
FIG. 2 shows how the separatrix of the hollow cathode magnetron source of FIG. 1 is affected by varying current through a coil.

Because HCM source 150 can sustain a high density plasma, atoms sputtered from target 104 will have a high probability of becoming ionized. Thus, plasma escaping out of container 120 will mostly consist of ions and electrons which are affected by magnetic fields. By varying the shape of the magnetic fields of magnetic stack 103, the plasma escaping from container 120 can thus be directionally controlled. A coil 111 is placed at a distance from the opening of cathode 110 to vary the shape of the separatrix of HCM 150 (i.e. field line 108). As shown in FIG. 2, by adjusting the current through coil 111, thereby varying the strength of its magnetic field, the shape of the separatrix and plasma flow indicated by arrows 112 can be controlled. A coil current in the order of ±0 to 5 A, which corresponds to ±0 to 2500 Amp-turn, can change the plasma flow from a highly focused beam to a widely spread profile. Thus, by varying the magnetic field strength of coil 111, the profile of the plasma streaming onto the substrate can be controlled to achieve a desired deposition uniformity. It is to be noted that deposition uniformity is extremely sensitive to the current in coil 111. For titanium deposition, for example, a mere variation of 0.05 to 0.1 A (10 to 20 Amp-turn) in coil current can cause a significant change in uniformity. The practitioner should therefore try different values of coil current in order to get the best uniformity for a given application.

Coil 111 can be used to control the plasma profile because the separatrix serves as a "lens element" in spreading or focusing the plasma escaping from container 120. This lens element effect is similar to ion extraction through an orifice where the electric field near the orifice operates as an aperture for the plasma. For the magnetic configuration shown in FIGS. 1 and 2, the separatrix operates as a diverging lens that spreads out the plasma streaming out of container 120. As shown in FIG. 2, the higher the coil current, the further magnetic null 107 moves away from the opening of cathode 110. A bottom pole piece 113 is used to minimize the movement of the ends of the separatrix with varying coil current. Because the ends of the separatrix remain relatively fixed on bottom pole piece 113 while magnetic null 107 moves, coil 111 is essentially a control "knob" for varying the "focal length" of the separatrix "lens" to control plasma flow from container 120. As FIG. 2 indicates, plasma spreads out more as coil current is increased.

The phrase "cost of ownership" refers to the cost of buying, operating, and maintaining a piece of equipment such as a magnetron apparatus. Ideally, a magnetron apparatus should provide the features of HCM source 150, including high deposition rate and good deposition uniformity, at a relatively low cost of ownership. Compared to a planar magnetron, an HCM source is more expensive to build because its hollow target has a more complicated shape. Furthermore, because of sputtering on its sidewalls, it is more difficult to achieve full face erosion with a hollow target.

Although a planar magnetron has a relatively low cost of ownership compared to an HCM source, conventional planar magnetrons do not create and maintain a separatrix. Without a separatrix, the benefits afforded by an HCM source would not be realized. The present invention employs a novel magnetic configuration to generate a separatrix in a planar magnetron, thereby providing the main benefits of an HCM source at a relatively low cost of ownership.

Figure 3A:
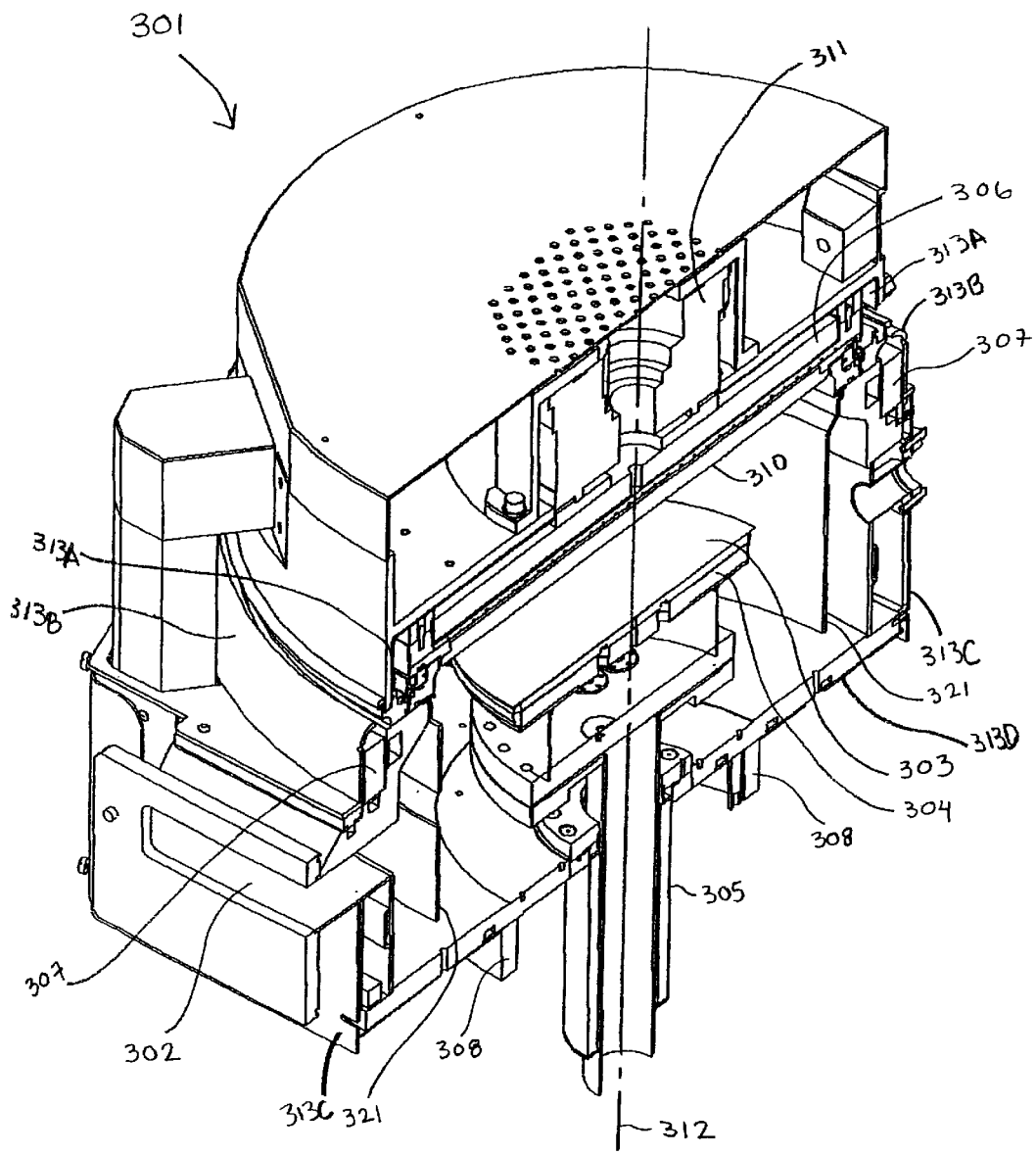
FIGS. 3A and 3B show a cut-away perspective view and a side cross-sectional view, respectively, of a magnetron module in accordance with an embodiment of the present invention.
Figure 3B:
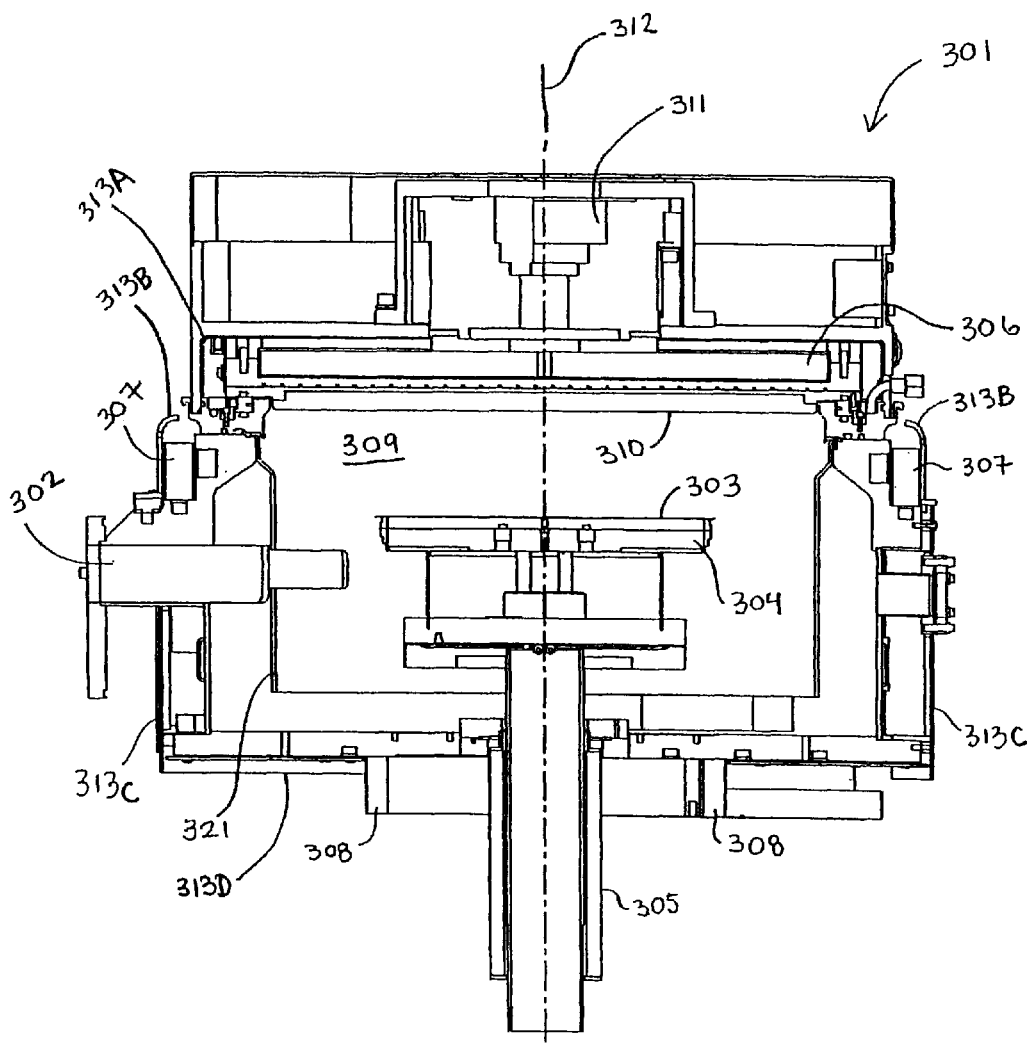

FIGS. 3A and 3B (collectively "FIG. 3") show a cut-away perspective view and a side cross-sectional view, respectively, of a magnetron module 301 in accordance with an embodiment of the present invention. Magnetron module 301 includes a port 302 through which a substrate 303 enters. Port 302 is closed using a gate such as a slit valve to vacuum seal a chamber 309 (see FIG. 3B) during operation. As used in the present disclosure, the term "substrate" includes wafers and any other type of workpieces.

A pedestal 304 supports a substrate 303 inside chamber 309. A pedestal lift assembly 305 vertically positions pedestal 304 to facilitate the placement of a substrate 303 thereon. The transportation of a substrate in and out of a reactor, in general, is known in the art and will not be further described here.

During operation, an inert gas (e.g., argon) is introduced in an evacuated chamber 309. There, a plasma of the inert gas is created at least between a substrate 303 and a target 310. Target 310 is made of material to be sputtered onto a substrate 303. For example, target 310 may be made of copper, titanium, aluminum, and other types of metals. Ions from the plasma accelerate towards target 310, thereby sputtering material off target 310 and onto a substrate 303.

To control the flow of material onto a substrate 303, magnetron module 301 further includes a main magnet assembly 306, a magnet 307, and a magnet 308. In the present disclosure, the term "magnet" generically refers to any type of magnet including permanent magnets and electro-magnetic coils. Note that magnets 307 and 308 surround chamber 309 about a symmetry axis 312. In magnetron module 301, magnet 307 is a circular magnet and located in the vicinity of target 310; magnet 308 is a circular magnet and located underneath a substrate 303. The diameter of magnet 308 is slightly larger than that of substrate 303.

In magnetron module 301, main magnet assembly 306 is rotated by a motor 311 about symmetry axis 312 in order to control the erosion profile of target 310. In one embodiment, main magnet assembly 306 rotates at a rate of two revolutions per second. U.S. Pat. No. 5,252,194 issued to Demaray et al., incorporated herein by reference in its entirety, also discloses the use of a rotating magnet behind a target to control the target's erosion profile.

Figure 4A:
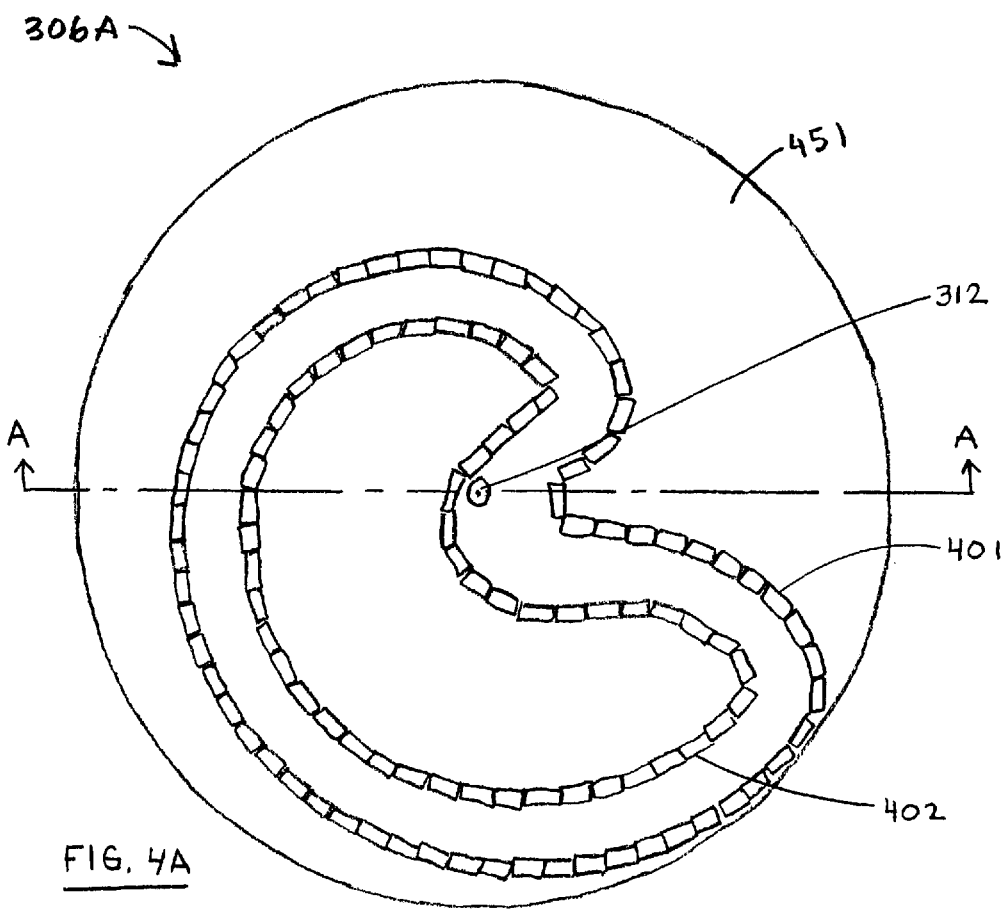
FIG. 4A shows a schematic diagram illustrating a rotating main magnet assembly in accordance with an embodiment of the present invention.
Figure 4B:
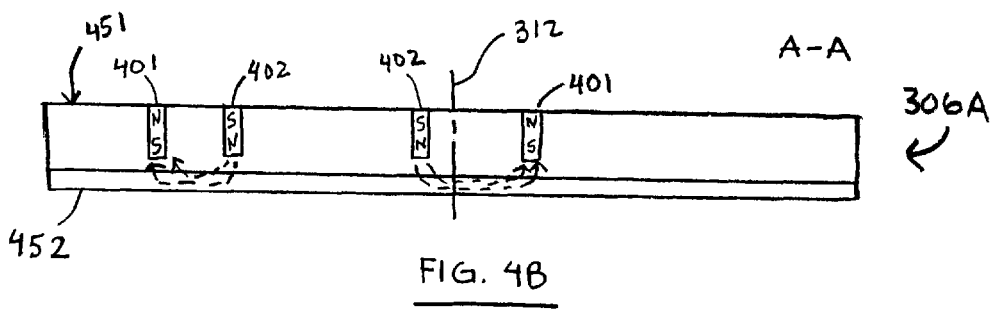
FIG. 4B shows a side cross-sectional view of the main magnet assembly of FIG. 4A.

FIG. 4A schematically shows a rotating main magnet assembly 306A in accordance with an embodiment of the present invention. FIG. 4B shows a side cross-sectional view of main magnet assembly 306A taken at section A—A of FIG. 4A. Main magnet assembly 306A is a specific embodiment of main magnet assembly 306. Main magnet assembly 306A rotates about an axis 312. When installed in a magnetron module, side 451 faces the substrate. Main magnet 306A includes looping magnets 401 and 402 of opposite polarity. Magnets 401 and 402 are "looping" in that the field lines from one magnet flow to the other magnet to create a magnetic tunnel as exemplified in FIG. 4B. In one embodiment, magnets 401 and 402 include two arrays of magnets of opposite polarity and arranged as shown in FIG. 4A. A pole plate 452, which may be of a soft magnetic material, completes the magnetic circuit formed by magnets 401 and 402.

Figure 4C:
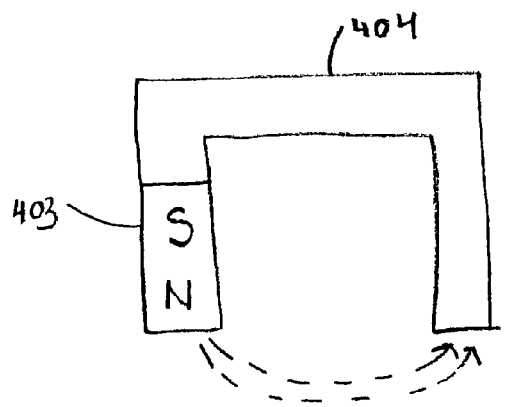
FIGS. 4C, 4D, and 4E, show cross-sectional views of looping magnets in accordance with embodiments of the present invention.
Figure 4D:
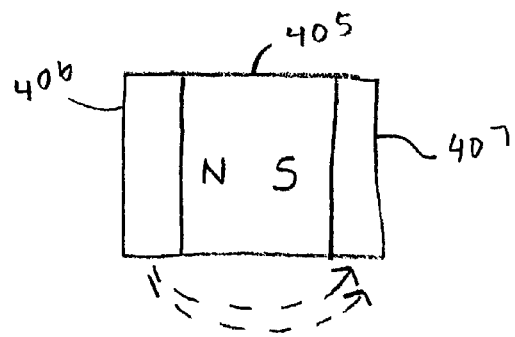
Figure 4E:
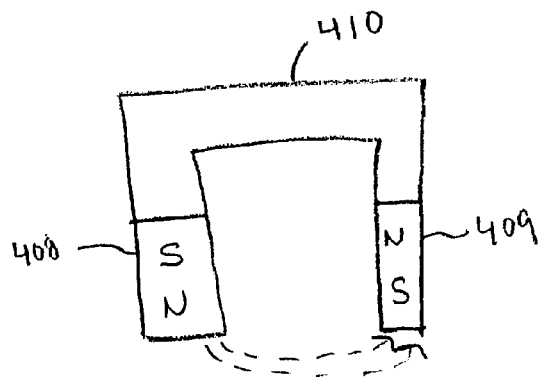
Figure 4F:
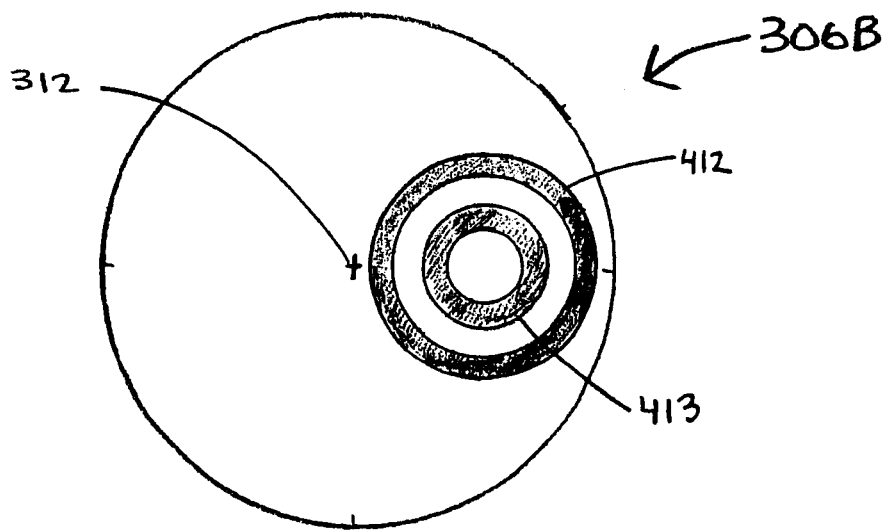
FIG. 4F shows a schematic diagram of a rotating main magnet assembly in accordance with an embodiment of the present invention.

As can be appreciated, the present invention is not limited by the configuration of the looping magnets. For example, FIGS. 4C, 4D, 4E, and 4F schematically illustrate alternative looping magnetic circuits. In FIG. 4C, a looping magnetic field is created by using a magnet 403 in conjunction with a soft magnetic material 404 (e.g., cold rolled steel, 400 series stainless steel) to form a U-shape. In FIG. 4D, a magnet 405 is sandwiched between soft magnetic materials 406 and 407. In FIG. 4E, magnets 408 and 409 form a U-shape with soft magnetic material 410. In FIG. 4F, looping magnets 412 and 413 have a circular shape. Rotating main magnet assembly 306B shown in FIG. 4F is a specific embodiment of main magnet 306 shown in FIG. 3.

Figure 4G:
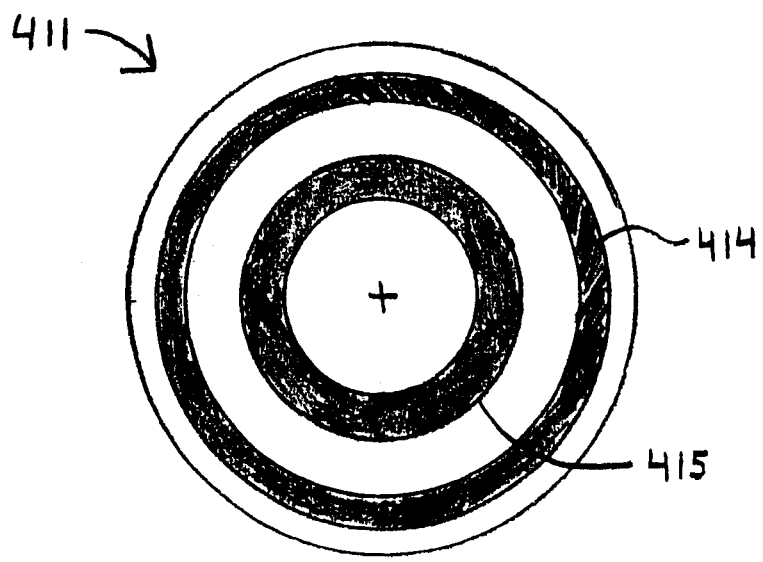
FIG. 4G shows a schematic diagram of a non-rotating main magnet assembly in accordance with an embodiment of the present invention.

As can be appreciated, a non-rotating main magnet assembly may also be used. Such a non-rotating main magnet may include looping magnets laid out along a complete track. In FIG. 4G, for example, a non-rotating main magnet 411 includes looping magnets 414 and 415. Main magnet 411 may be placed behind an essentially flat target in accordance with an embodiment of the present invention.

Referring back to FIGS. 3A and 3B, magnetic shields 313 (i.e., 313A, 313B, 313C, and 313D) surround chamber 309 to limit magnetic fields to within the magnetron module, and thereby minimize magnetic interference with external electronic devices and adjacent modules. Magnetic shields 313 may be made of a soft magnetic material such as cold rolled steel or 400 series stainless steel.

A sputtering shield 321 contains the plasma and protects the vacuum chamber from being coated by sputtered materials. Sputtering shield 321 also serves as the main ground reference for return current.

Figure 5A:
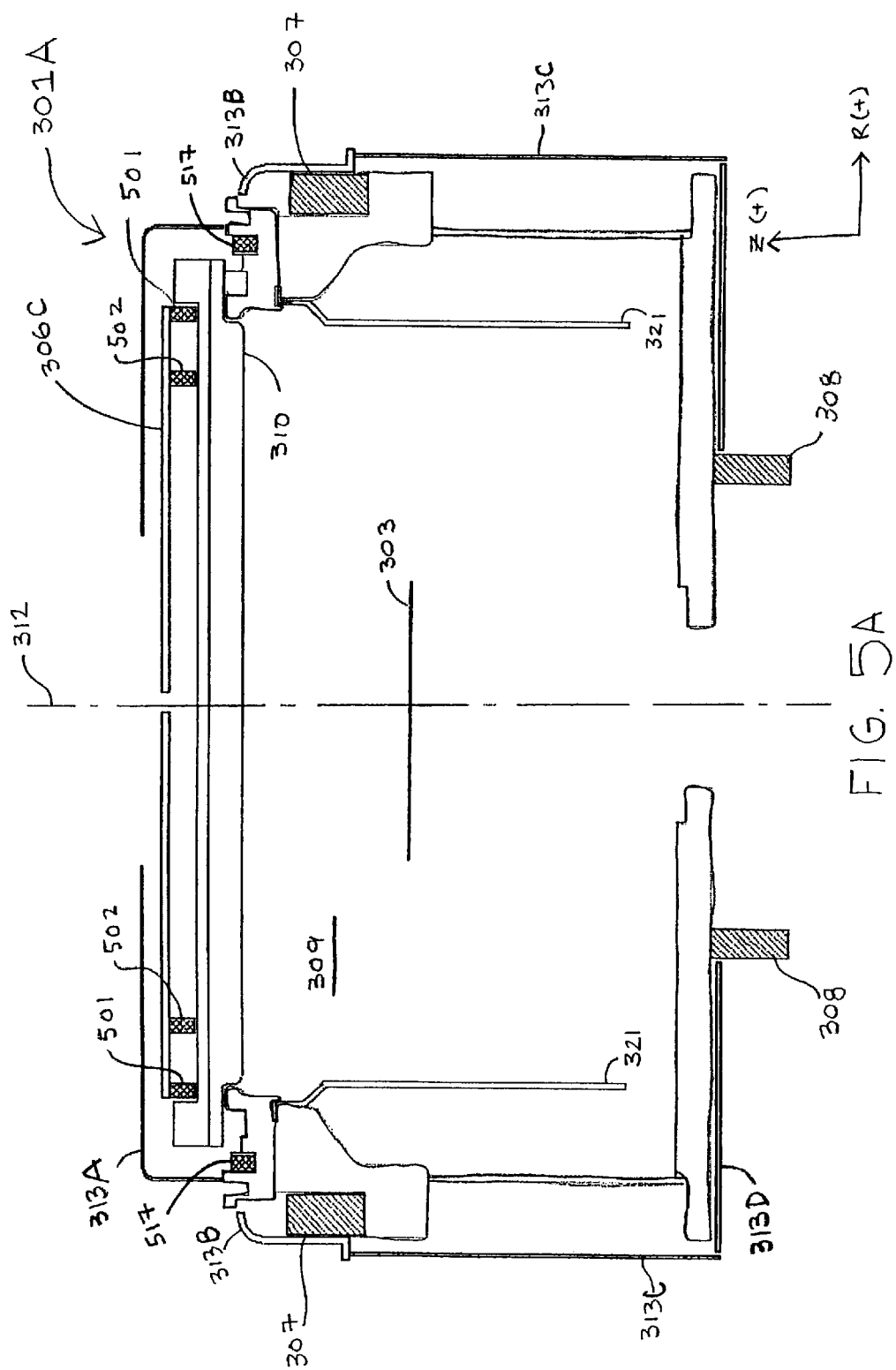
FIG. 5A shows a schematic diagram of a magnetron module in accordance with an embodiment of the present invention.

Referring now to FIG. 5A, there is shown a schematic diagram of a magnetron module 301A. Magnetron module 301A is a specific embodiment of magnetron module 301 shown in FIG. 3. Components not necessary to the understanding of the present embodiment are not shown in FIG. 5A for clarity of illustration.

Figure 7A:
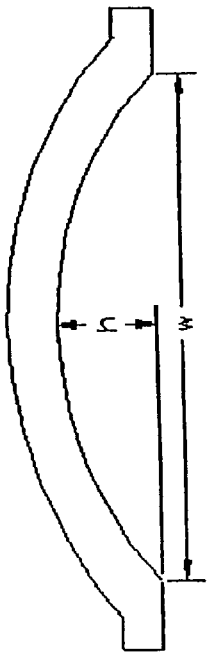
FIGS. 7A, 7B, 7C, 7D, 7E, and 7F show schematic diagrams of essentially flat targets in accordance with embodiments of the present invention.
Figure 7B:
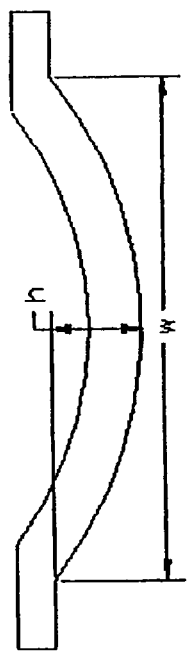
Figure 7C:
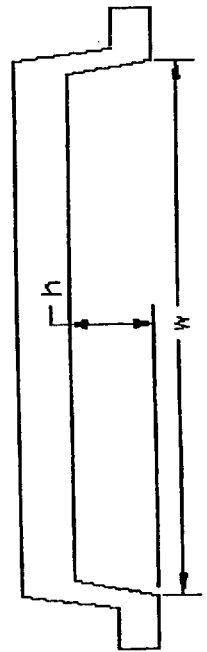
Figure 7D:
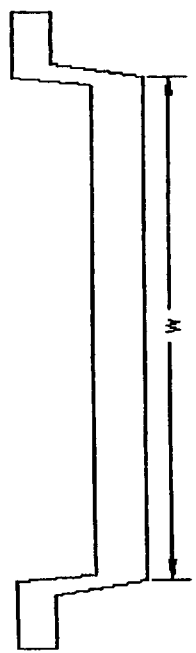
Figure 7E:
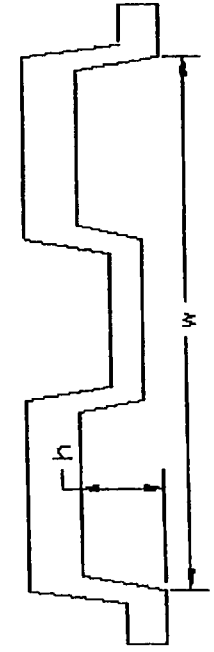
Figure 7F:
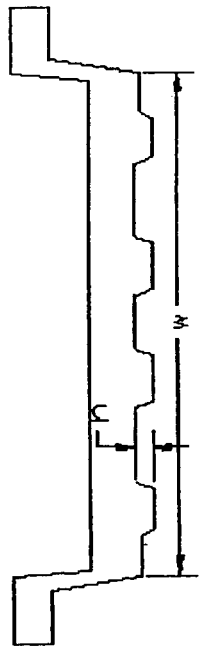

In one embodiment, a target 310 is an essentially flat target having a small height-to-width ratio. For example, a target 310 may be planar as depicted in FIG. 5A. A target 310 may also have a dish shape as shown in FIGS. 7A and 7B or stepped shape as shown in FIGS. 7C, 7D, 7E, and 7F. In the examples of FIG. 7, the height-to-width ratio (i.e., height "h" divided by width "w") of the targets is less than 0.5. Because the target has a small height-to-width ratio in the above mentioned examples, the physical structure of the target itself is not suitable for plasma confinement. In the present invention, plasma confinement near the target is achieved using magnetic fields.

Referring back to FIG. 5A, the main magnetic fields of magnetron module 301A are generated by a rotating main magnet assembly 306C. Main magnet assembly 306C shown in FIG. 5A is a specific embodiment of main magnet 306 shown in FIG. 3. The magnetic fields generated by main magnet assembly 306C come from looping magnets 501 and 502. In magnetron module 301A, looping magnets 501 and 502 may be made of rare earth magnets (e.g., NdFeB) to obtain strong magnetic fields.

Figure 5B:
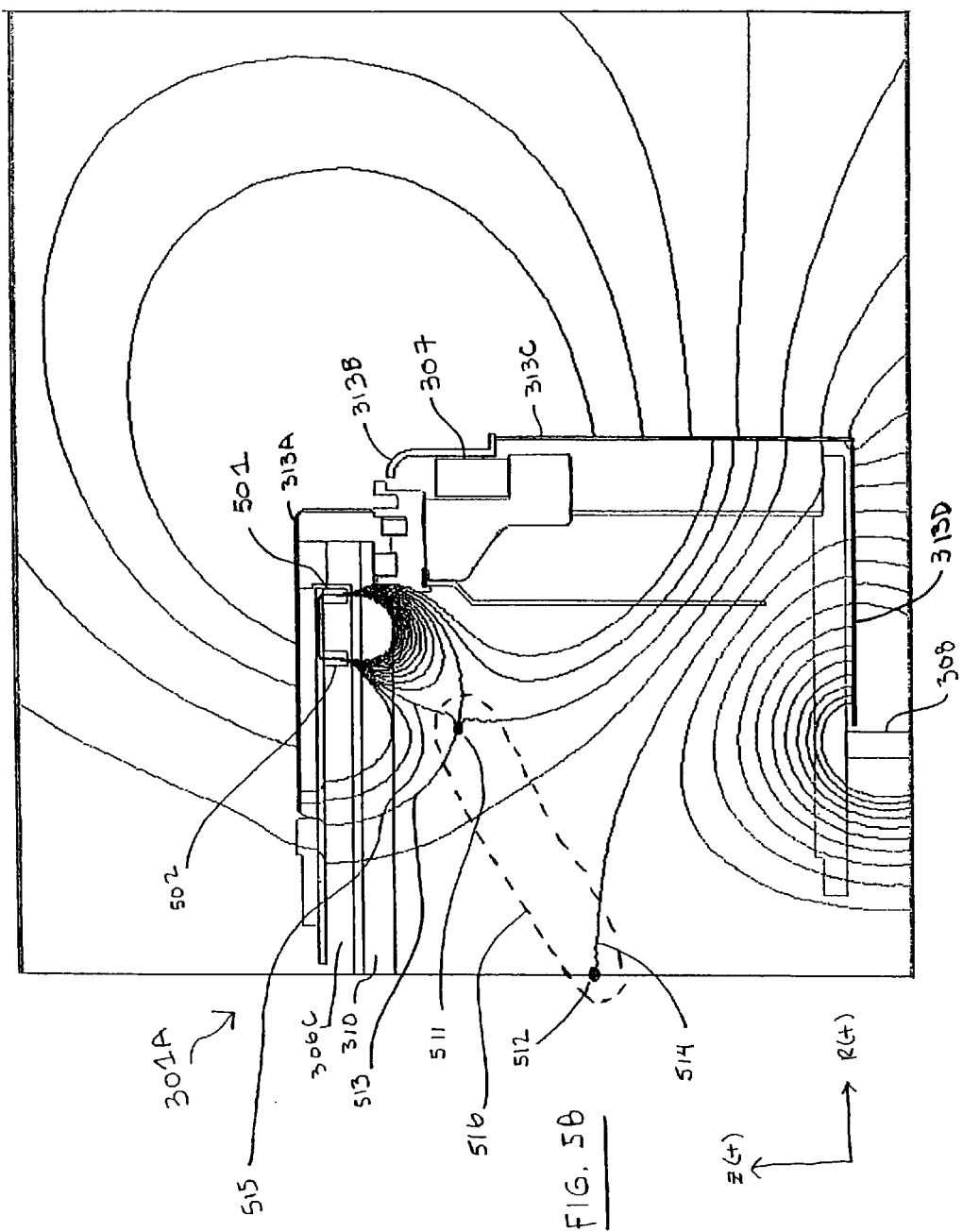
FIG. 5B shows a magneto-static simulation plot of the magnetron module of FIG. 5A.

Magnetron module 301A includes a magnet 307 located near target 310 and a magnet 308 located underneath a substrate 303. In magnetron module 301A, magnet 307 and magnet 308 are both electro-magnetic coils with wires wound in the azimuthal direction to generate magnetic fields in the axial direction. Additionally, magnet 307 is configured to buck (i.e., push away) the magnetic fields from the looping magnets of rotating main magnet assembly 306C, which is located behind target 310. Also in magnetron module 301A, magnet 308 is configured to generate magnetic fields having an orientation opposite to the orientation of magnetic fields generated by magnet 307. Because magnets 307 and 308 are both electro-magnetic coils in magnetron module 301A, this is accomplished by running the current in magnet 308 in a direction opposite to that of magnet 307. That is, if the current in magnet 307 is (+) amp-turn, the current through magnet 308 is (−) amp-turn and vice versa. In one example, the current in magnet 307 is +2000 amp-turn while the current in magnet 308 is −4000 amp-turn. The effect of the just mentioned magnetic configuration is now explained with reference to FIG. 5B, which shows a magneto-static simulation of a magnetron module 301A. Note that FIG. 5B shows the result of simulating an axisymmetric magnetic configuration. For an asymmetric magnetic configuration, the nulls will be off-axis but the same analysis applies.

As shown in FIG. 5B, configuring magnet 307 to buck the main magnetic fields from main magnet assembly 306C and configuring magnet 308 to generate magnetic fields opposite to that generated by magnet 307 result in a null 511 near target 310 and a null 512 in front of a substrate (not shown in FIG. 5B). Nulls 511 and 512 are regions where magnetic field strength is very weak and, typically but not necessarily, approaches about zero Gauss. The resulting separatrix 513 and separatrix 515, which pass through null 511, confine high density plasma. The confined high density plasma provides the majority of ions that sputter material off target 310. Separatrix 514, which passes through null 512, controls the flow of plasma to the substrate. By varying the strength of the magnetic fields generated by magnets 307 and 308, the shape of separatrix 514 may be varied to obtain a desired deposition uniformity.

Because magnetic field strength is very weak in the regions near null 511 and null 512, ions from the plasma confined by separatrix 513 and separatrix 515 flow through the region near null 511, to the region near null 512, and onto the substrate. This path of weak magnetic field strength is schematically depicted in FIG. 5B as dashed region 516. Region 516 may be a large region of uniform plasma. In light of the present disclosure, persons of ordinary skill in the art will appreciate that the strength of the main magnetic fields from main magnet assembly 306C and the current through magnets 307 and 308 may be optimized for a specific magnetron apparatus. Optimization tools that may be used include the Maxwell electromagnetic simulation software from Ansoft Corporation. Using the just mentioned magnetic simulation software, the skilled practitioner may experiment with different magnetic field strengths for main magnet assembly 306C, magnet 307, and magnet 308 to obtain the best settings for a particular application. For example, the plot of FIG. 5B was obtained by using the value of 45 MGO NdFeB magnets for main magnetic assembly 306C, a value of 2000 amp-turn for magnet 307, and a value of −4000 amp-turn for magnet 308 in the magnetic simulation software.

Referring back to FIG. 5A, magnetron module 301A may optionally include a magnet 517 located near the edge of target 310. In magnetron module 301A, magnet 517 may be used to shape and fine tune the magnetic fields generated by main magnet assembly 306C. In one embodiment, magnet 517 bucks the magnetic fields from main magnet assembly 306C to prevent the plasma from extending past the edge of target 310 and thereby avoid electron loss. This also helps improve erosion on the edges of target 310.

Figure 6A:
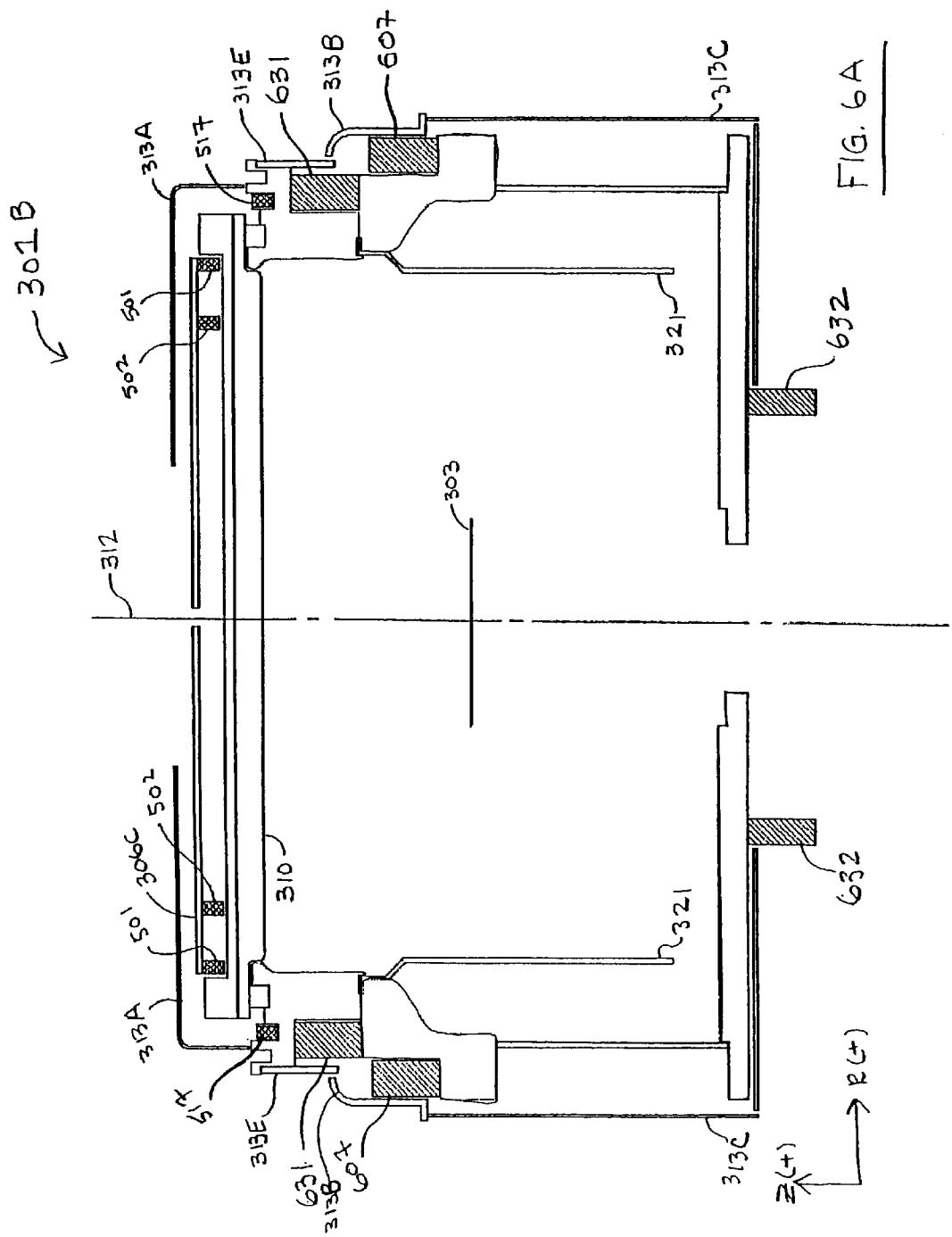
FIG. 6A shows a schematic diagram of a magnetron module in accordance with another embodiment of the present invention.

As can be appreciated by persons of ordinary skill in the art reading the present disclosure, the number and type of magnets used in magnetron module 301 may be varied to optimize a given magnetic configuration. For example, FIG. 6A shows a schematic diagram of a magnetron module 301B in accordance with an embodiment of the present invention. Magnetron module 301B is a specific embodiment of magnetron module 301 shown in FIG. 3. Components not necessary to the understanding of the present embodiment are not shown in FIG. 6A for clarity of illustration. Just like magnetron module 301A shown in FIG. 5A, magnetron module 301B includes an essentially flat target 310, a main magnet assembly 306C having looping magnets 501 and 502, a magnet 517 for improved edge erosion, a sputtering shield 321, and magnetic shields 313.

As shown in FIG. 6A, magnetron module 301B includes a magnet 631 near target 310, a magnet 632 underneath a substrate 303, and a magnet 607 between magnets 631 and 632. Compared to magnetron module 301A which includes two auxiliary magnets (magnets 307 and 308), magnetron module 301B includes three auxiliary magnets (magnets 631, 632, and 607). To accommodate the additional magnet, target 310 is moved further back and an additional magnetic shield denoted as magnetic shield 313E is installed. In magnetron module 301B, magnets 631, 632, and 607 are electro-magnetic coils with wires wound in the azimuthal direction.

In magnetron module 301B, magnet 631 is configured to buck the magnetic fields from looping magnets 501 and 502, while magnets 607 and 632 are both configured to generate magnetic fields having an orientation opposite to the orientation of magnetic fields generated by magnet 631. The effect of the just mentioned magnetic configuration is now described with reference to the magneto-static simulation plot of FIG. 6B. As shown in FIG. 6B, configuring magnet 631 to buck the main magnetic fields from main magnet assembly 306C, and configuring magnets 607 and 632 to generate magnetic fields opposite to that generated by magnet 631 result in a null 621 in front of the substrate (not shown in FIG. 6B) and a null 622 near target 310. Nulls 621 and 622 are regions where magnetic field strength is very weak and, typically but not necessarily, approaches about zero Gauss. The resulting separatrix which pass through null 622 confine high density plasma. The confined high density plasma provides the majority of ions that sputter material off target 310. Separatrix 623, which also passes through null 621, controls the flow of plasma to the substrate. Magnet 607 enables fine tuning of the magnetic shields to obtain a single separatrix connecting both nulls 621 and 622, thus allowing the confined plasma to combine and fill a large volume in front of the substrate. By varying the strength of the magnetic fields generated by magnets 631, 632, and 607, the shape of separatrix 621 and separatrix 624 may be varied to obtain a desired deposition uniformity and deposition rate.

For example, the plot of FIG. 6B was obtained by using the value of 45 MGO NdFeB for main magnetic assembly 306C, a value of +2000 amp-turn for magnet 631, a value of −1200 amp-turn for magnet 607, and a value of −1200 amp-turn for magnet 632 in the magnetic simulation software.

Because magnetic field strength is very weak in the regions near null 621 and null 622, ions from the plasma confined by separatrix 624 and separatrix 623 flow through the region near null 622, to the region near null 621, and onto the substrate. This path of weak magnetic field strength is schematically depicted in FIG. 6B as dashed region 641. In light of the present disclosure, persons of ordinary skill in the art will appreciate that the strength of the main magnetic fields from main magnet assembly 306C and the current through magnets 607, 631, and 632 may be optimized to meet specific applications.

An improved null-field magnetron apparatus has been disclosed. While specific embodiments have been provided, it is to be understood that these embodiments are for illustration purposes and not limiting. Many additional embodiments will be apparent to persons of ordinary skill in the art reading this disclosure. For example, permanent magnets having predetermined magnetic field strength may be used in place of electro-magnetic coils, and vice-versa. Further, the number, type, and shape of components disclosed herein may be varied while remaining within the scope and spirit of the present invention. Thus, the present invention is limited only by the following claims.

What is claimed is:

1. A magnetron apparatus comprising:
   a main magnet configured to generate main magnetic fields;
   an essentially flat target having a first side facing the main magnet and a second side facing a substrate;
   a first magnetic element located between the essentially flat target and the substrate, the first magnetic element configured to generate magnetic fields that buck the main magnetic fields; and
   a second magnetic element located below the substrate, the second magnetic element configured to generate magnetic fields opposite to the magnetic fields generated by the first magnetic element.

2. The magnetron apparatus of claim 1 wherein the essentially flat target is dish shaped.

3. The magnetron apparatus of claim 1 wherein the essentially flat target is planar.

4. The magnetron apparatus of claim 1 wherein the essentially flat target is stepped.

5. The magnetron apparatus of claim 1 wherein the first magnetic element includes an electro-magnetic coil.

6. The magnetron apparatus of claim 1 wherein the first magnetic element includes a permanent magnet.

7. The magnetron apparatus of claim 1 further comprising a third magnetic element located between the first magnetic element and the substrate, the third magnetic element configured to generate magnetic fields opposite to the magnetic fields generated by the first magnetic element.

8. The magnetron apparatus of claim 1 further comprising a magnet located near an edge of the essentially flat target.

9. A magnetron apparatus comprising:
   a main magnet;
   an essentially flat target having a first side facing the main magnet and a second side facing a substrate;
   a first magnetic element located between the essentially flat target and the substrate;
   a second magnetic element located below the substrate; and wherein the first magnetic element and the second magnetic element generate magnetic fields to create at least a first null region near the essentially flat target and a second null region between the essentially flat target and the substrate.

10. The magnetron apparatus of claim 9 wherein the essentially flat target is dish shaped.

11. The magnetron apparatus of claim 9 wherein the essentially flat target is planar.

12. The magnetron apparatus of claim 9 wherein the essentially flat target is stepped.

13. The magnetron apparatus of claim 9 further comprising a third magnetic element located between the first magnetic element and the substrate, the third magnetic element configured to generate magnetic fields opposite to the magnetic fields generated by the first magnetic element.

14. The magnetron apparatus of claim 9 further comprising a magnet located near an edge of the essentially flat target.

15. A method of magnetron sputtering comprising:
generating main magnetic fields from behind an essentially flat target;
generating a first set of magnetic fields near the essentially flat target;
generating a second set of magnetic fields from below a substrate; and
wherein the first set of magnetic fields and the second set of magnetic fields create at least a first separatrix confining plasma near the essentially flat target and a second separatrix controlling the flow of plasma to the substrate.

16. The method of claim 15 further comprising adjusting the shape of the second separatrix to control the flow of plasma onto the substrate.

17. A method of magnetron sputtering comprising:
generating main magnetic fields near an essentially flat target;
generating a first set of magnetic fields near the essentially flat target to buck the main magnetic fields; and
generating a second set of magnetic fields from below a substrate, the second set of magnetic fields having an orientation opposite to the orientation of the first set of magnetic fields.

18. The method of claim 17 wherein a source of the first set of magnetic fields includes an electro-magnetic coil.

19. The method of claim 17 wherein a source of the second set of magnetic fields includes an electro-magnetic coil.

20. The method of claim 17 further comprising:
generating a third set of magnetic fields from between a source of the first set of magnetic fields and a source of the second set of magnetic fields, the third set of magnetic fields having an orientation opposite to the orientation of the first set of magnetic fields.

* * * * *